(12) United States Patent
Quiquempoix

(10) Patent No.: US 8,970,416 B2
(45) Date of Patent: Mar. 3, 2015

(54) 4N+1 LEVEL CAPACITIVE DAC USING N CAPACITORS

(71) Applicant: Microchip Technology Incorporated, Chandler, AZ (US)

(72) Inventor: Vincent Quiquempoix, Divonne les bains (FR)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 14/202,823

(22) Filed: Mar. 10, 2014

(65) Prior Publication Data

US 2014/0253355 A1 Sep. 11, 2014

Related U.S. Application Data

(60) Provisional application No. 61/776,596, filed on Mar. 11, 2013.

(51) Int. Cl.
*H03M 3/00* (2006.01)
*H03M 1/80* (2006.01)
*H03M 1/06* (2006.01)

(52) U.S. Cl.
CPC ............... *H03M 1/802* (2013.01); *H03M 3/30* (2013.01); *H03M 1/0665* (2013.01); *H03M 3/464* (2013.01); *H03M 3/424* (2013.01)
USPC .......................................... 341/143; 341/155

(58) Field of Classification Search
CPC ....... H03M 3/00; H03M 3/424; H03M 1/802; H03M 1/0665
USPC .................................. 341/143, 155, 172, 144
See application file for complete search history.

(56) References Cited

U.S. PATENT DOCUMENTS

| | | | |
|---|---|---|---|
| 5,818,377 A | 10/1998 | Wieser | 341/144 |
| 6,873,276 B2* | 3/2005 | Yang et al. | 341/143 |
| 7,102,557 B1* | 9/2006 | Frith | 341/150 |
| 7,102,558 B2 | 9/2006 | Deval | 341/150 |
| 7,167,119 B1* | 1/2007 | Lei et al. | 341/143 |
| 7,961,125 B2 | 6/2011 | Deval et al. | 341/131 |
| 7,994,958 B2 | 8/2011 | Quiquempoix et al. | 341/150 |
| 8,009,077 B1 | 8/2011 | Melanson | 341/155 |
| 2014/0167995 A1* | 6/2014 | Tiew et al. | 341/143 |

OTHER PUBLICATIONS

Adams, R.W. et al., "Theory and Practical Implementation of a Fifth-Order Sigma-Delta A/D Converter," AES Journal of Audio Engineering Society, vol. 39, No. 7/8, 14 pages, Jul. 1991.
Alexander, Mark A. et al., "A 192ks/s Sigma-Delta ADC with Integrated Decimation Filters Providing -97.4dB THD," IEEE International Solid-State Circuit Conference, 2 pages, Feb. 17, 1994.
International Search Report and Written Opinion, Application No. PCT/US2014/022650, 13 pages, Jul. 7, 2014.

* cited by examiner

*Primary Examiner* — Peguy Jean Pierre
(74) *Attorney, Agent, or Firm* — King & Spalding L.L.P.

(57) ABSTRACT

A digital-to analog converter (DAC) of the charge transfer type for use in a sigma delta modulator, includes a capacitor switch unit operable to generate a 4n+1 output levels, comprising: a plurality of second switching units for coupling first terminals of a plurality of reference capacitor pairs with either a positive or a negative reference signal; wherein the second terminals of the plurality of reference capacitor pairs are coupled in parallel, respectively; wherein for even transfers a single switching combination is provided to achieve linearity and wherein for odd transfers an average of different switching combinations is provided to achieve linearity; wherein an even transfer is when an input of the DAC is even and an odd transfer is when an input to the DAC is odd.

18 Claims, 6 Drawing Sheets

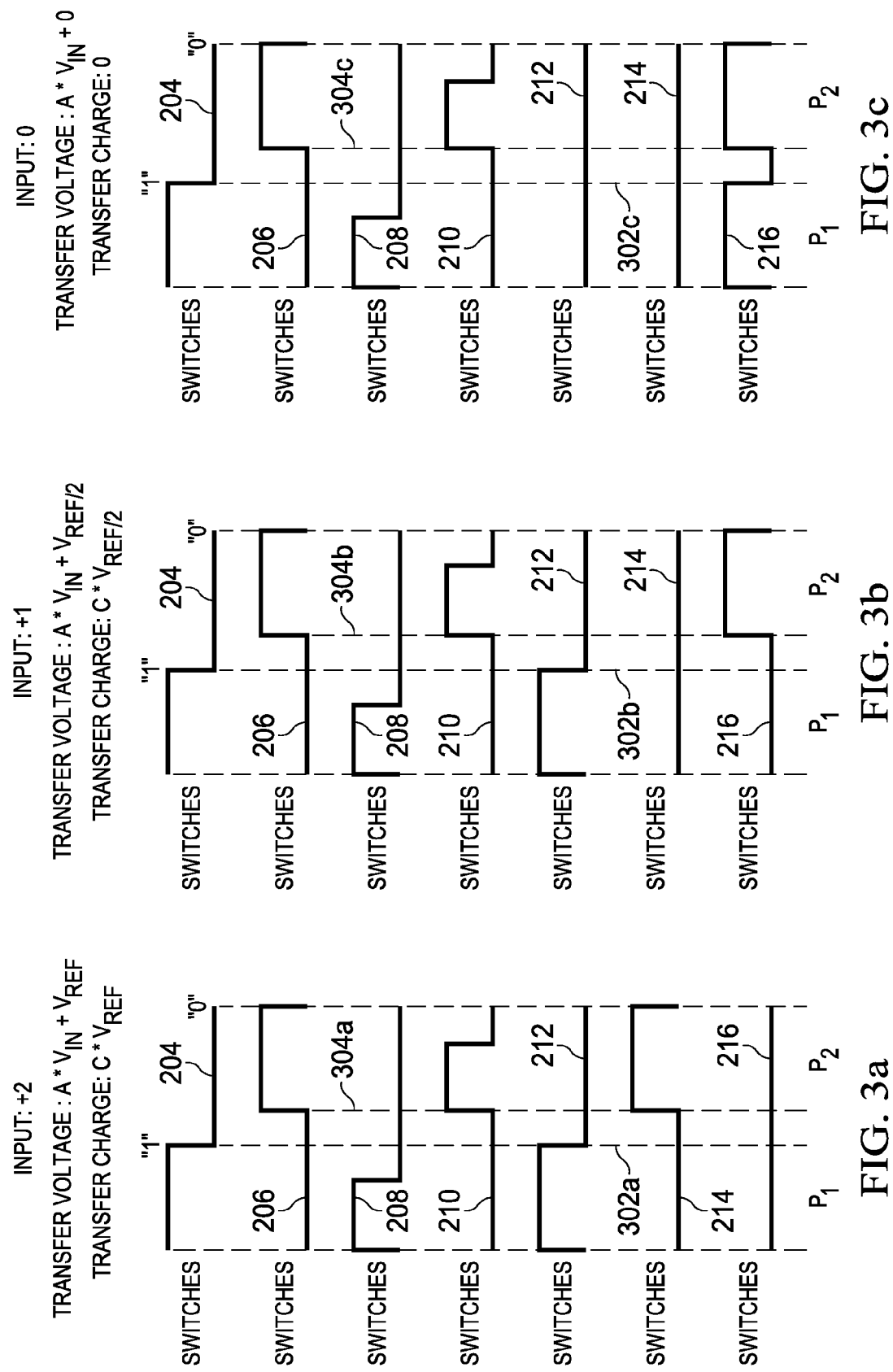

FIG. 5

| DAC INPUT | P1 TRANSFER ON C1 | P2 TRANSFER ON C1 | P1 TRANSFER ON C2 | P2 TRANSFER ON C2 | SUM OF ALL TRANSFERS | SUM OF TRANSFERS (NORMALIZED TO C*Vref/4) |
|---|---|---|---|---|---|---|
| 4 | C/4*Vref | C/4*Vref | C/4*Vref | C/4*Vref | C*Vref | 4 |
| 3 | C/4*Vref | C/4*Vref | C/4*Vref | 0 | 3/4C*Vref | 3 |
| 2 | C/4*Vref | C/4*Vref | 0 | 0 | 1/2C*Vref | 2 |
| 1 | C/4*Vref | 0 | 0 | 0 | 1/4C*Vref | 1 |
| 0 | 0 | 0 | 0 | 0 | 0 | 0 |
| -1 | -C/4*Vref | 0 | 0 | 0 | -1/4C*Vref | -1 |
| -2 | -C/4*Vref | -C/4*Vref | 0 | 0 | -1/2C*Vref | -2 |
| -3 | -C/4*Vref | -C/4*Vref | -C/4*Vref | 0 | -3/4C*Vref | -3 |
| -4 | -C/4*Vref | -C/4*Vref | -C/4*Vref | -C/4*Vref | -C*Vref | -4 |

FIG. 6

| DAC INPUT | P1 TRANSFER ON C1 | P2 TRANSFER ON C1 | P1 TRANSFER ON C2 | P2 TRANSFER ON C2 | SUM OF ALL TRANSFERS | SUM OF TRANSFERS NORMALIZED TO (C1+C2)/8 |
|---|---|---|---|---|---|---|
| 4 | C1/4*Vref | C1/4*Vref | C2/4*Vref | C2/4*Vref | (C1+C2)/2*Vref | 4 |
| 2 | C1/4*Vref | 0 | C2/4*Vref | 0 | (C1+C2)/4*Vref | 2 |
| 0 | 0 | 0 | 0 | 0 | 0 | 0 |
| -2 | -C1/4*Vref | 0 | -C2/4*Vref | 0 | -(C1+C2)/4*Vref | -2 |
| -4 | -C1/4*Vref | -C1/4*Vref | -C2/4*Vref | -C2/4*Vref | -(C1+C2)/2*Vref | -4 |

FIG. 7

| DAC INPUT | P1 TRANSFER ON C1 | P2 TRANSFER ON C1 | P1 TRANSFER ON C2 | P2 TRANSFER ON C2 | SUM OF ALL TRANSFERS | AVERAGE OF TWO ADJACENT LINES: |
|---|---|---|---|---|---|---|
| 3 | C1/4*Vref | C1/4*Vref | C2/4*Vref | 0 | (2*C1+C2)/4*Vref | |
| 3 | C1/4*Vref | 0 | C2/4*Vref | C2/4Vref | (C1+2C2)/4*Vref | 3(C1+C2)/8 Vref |
| 1 | C1/4*Vref | 0 | 0 | 0 | C1/4*Vref | |
| 1 | 0 | 0 | C2/4*Vref | 0 | C2/4*Vref | (C1+C2)/8 Vref |
| -1 | -C1/4*Vref | 0 | 0 | 0 | -C1/4*Vref | |
| -1 | 0 | 0 | -C2/4*Vref | 0 | -C2/4*Vref | -(C1+C2)/8 Vref |
| -3 | -C1/4*Vref | 0 | -C2/4*Vref | -C2/4Vref | -(2*C1+C2)/4*Vref | |
| -3 | -C1/4*Vref | -C1/4*Vref | -C2/4*Vref | 0 | -(C1+2C2)/4*Vref | -3(C1+C2)/8 Vref |

FIG. 8

| SAMPLE | P1 TRANSFER ON C1 | P2 TRANSFER ON C1 | P1 TRANSFER ON C2 | P2 TRANSFER ON C2 | SUM OF ALL TRANSFERS | TRANSFER SEQUENCE (START CHOSEN RANDOMLY) |
|---|---|---|---|---|---|---|
| 1 | C1/4*Vref | C1/4*Vref | C2/4*Vref | 0 | (2*C1+C2)/4*Vref | C1 FIRST (CHOSEN RANDOMLY) |
| 2 | C1/4*Vref | 0 | C2/4*Vref | C2/4Vref | (C1+2C2)/4*Vref | C2 SECOND (ENDS SEQUENCE) |
| 3 | C1/4*Vref | 0 | C2/4*Vref | C2/4Vref | (C1+2C2)/4*Vref | C2 FIRST (CHOSEN RANDOMLY) |
| 4 | C1/4*Vref | C1/4*Vref | C2/4*Vref | 0 | (2*C1+C2)/4*Vref | C2 SECOND (ENDS SEQUENCE) |

4N+1 LEVEL CAPACITIVE DAC USING N CAPACITORS

CROSS REFERENCE TO RELATED APPLICATIONS

This application claims priority to commonly owned U.S. Provisional Patent Application Ser. No. 61/776,596 filed Mar. 11, 2013; which is hereby incorporated by reference herein for all purposes.

TECHNICAL FIELD

The present disclosure relates to digital to analog converters (DAC), in particular use of such DAC in sigma delta modulators.

BACKGROUND

Analog-to-digital converters are in widespread use today in electronics for consumers, industrial applications, etc. Typically, analog-to-digital converters include circuitry for receiving an analog input signal and outputting a digital value proportional to the analog input signal. This digital output value is typically in the form of either a parallel word or a serial digital bit string. There are many types of analog-to-digital conversion schemes such as voltage-to-frequency conversion, charge redistribution, delta modulation, as well as others. Typically, each of these conversion schemes has its advantages and disadvantages. One type of analog-to-digital converter that has seen increasing use is the switched capacitor sigma-delta converter.

As many analog-to-digital converters, the switched capacitor sigma-delta converter uses a digital-to-analog converter DAC in a feedback loop as shown in FIG. 1 and cannot be more linear than the digital-to-analog converter. An input signal U is fed to a Loop Filter. The output signal Y of the Loop Filter is forwarded to a Quantizer which provides the output bitstream V. This bitstream V is fed back to the DAC whose output is fed back to the Loop Filter. Therefore a very linear digital-to-analog converter is required in order to achieve a perfectly linear analog-to-digital conversion. However a high resolution is not required for the digital-to-analog converter used in the feedback loop of a sigma-delta converter: The digital-to-analog resolution can be exchanged with the over-sampling ratio at the cost of a longer conversion time.

A two-level digital-to-analog converter is inherently linear and thus is not the limiting factor for the accuracy of a sigma-delta converter. Therefore it is the standard approach in a sigma-delta analog-to-digital converter. Such A/D converters are for example disclosed in the article "A 192 ks/s Sigma-Delta ADC with integrated DecimationFilters Providing −97.4 dB THD" by Mark A. Alexander, Hessam Mohajeri, and Justin O. Prayogo in IEEE International Solid State Circuit Conference 37 (1994) February, New York, US, and "Theory and Practical Implementation of a fifth-Order Sigma-Delta A/D Converter" by R. W. Adams, P. F. Ferguson, A. Ganesan, S. Vincelette, A. Volpe, and R. Libert in AES Journal of the Audio Engineering Society 39 (1991) July/August, No. 7/8., New York, US. A five level feedback digital-to-analog converter is also known from U.S. Pat. No. 7,102,558 assigned to Applicant which is hereby incorporated by reference.

In sigma delta converters, capacitive charge transfer DACs are often used to realize the feedback of the modulator if the modulator is made of switched capacitors. Multi-bit architectures have nice advantages including less quantization noise, more stability, less sensitivity to idle tones as well as better distortion behavior. Since the DAC output resides at the input of the modulator, the inaccuracies of the DAC are directly transmitted to the signal and are difficult to compensate for. Therefore, it is critical to be able to realize linear DACs with as many levels as possible (making a multi level flash ADC is easier since in a sigma delta modulator, it does not require as much accuracy as the DAC as it stands at the end of the signal chain). Multi-level DAC with more than 5 levels require multiple capacitors and dynamic element matching to be able to transfer the signals in two phases (most of the sigma delta modulators based on switched capacitors have two phases one for sampling signals one for transferring signals to the next stage). These multi-level DACs are typically realized as charge transfer DAC. In these type of DACs, each output level is defined by a different amount of electrical charge transferred to the output of the DAC. Thus, a charge transfer DAC is transferring charges and therefore operates differently than a voltage or current DAC.

However, multi-level DAC with more than five levels require multiple capacitors and dynamic element matching to be able to transfer the signals in two phases (most of the sigma delta modulators based on switched capacitors have two phases: one for sampling signals and one for transferring signals to the next stage).

SUMMARY

A digital-to analog converter (DAC) of the charge transfer type for use in a sigma delta modulator, in accordance with embodiments, includes a capacitor switch unit operable to generate a 4n+1 output levels, comprising: a plurality of second switching units for coupling first terminals of a plurality of reference capacitor pairs with either a positive or a negative reference signal; wherein the second terminals of the plurality of reference capacitor pairs are coupled in parallel, respectively; wherein for even transfers a single switching combination is provided to achieve linearity and wherein for odd transfers an average of different switching combinations is provided to achieve linearity; wherein an even transfer is when an input of the DAC is even and an odd transfer is when an input to the DAC is odd. In some embodiments, the switches for each one of the plurality of second switching units are independently controlled.

A sigma delta modulator according to embodiments includes a DAC of the charge transfer type including a capacitor switch unit operable to generate a 4n+1 output levels, and a plurality of second switching units for coupling first terminals of a plurality of reference capacitor pairs with either a positive or a negative reference signal; wherein the second terminals of the plurality of reference capacitor pairs are coupled in parallel, respectively; and a first switching unit for coupling first terminals of an input capacitor pair with either a positive or a negative input signal, wherein the second terminals of the input capacitor pairs and the plurality of reference capacitor pairs are coupled in parallel, respectively; wherein for even transfers a single switching configuration is provided to achieve linearity and wherein for odd transfers an average of different switching combinations is provided to achieve linearity; wherein an odd transfer is when an input of the DAC is even and an odd transfer is when an input to the DAC is odd. In some embodiments, the modulator includes a switching network coupling the second terminals of the input and reference capacitors with a differential amplifier.

A digital-to-analog converter (DAC) of the charge transfer type, in accordance with embodiments includes a reference voltage switching arrangement comprising n individual five-level reference voltage switching arrangements in parallel; a switched capacitor stage for generating 4n+1 output voltage levels; and a switching controller, the switching controller configured to control switching configurations; wherein for even transfers a single switching configuration is provided to achieve linearity and wherein for odd transfers an average of different switching combinations is provided to achieve linearity; wherein an even transfer is when an input of the DAC is even and an odd transfer is when an input to the DAC is odd. In some embodiments, the switching controller configured to aperiodically select an order of transfers for odd transfers.

A digital-to-analog converter (DAC) of the charge transfer type in accordance with embodiments includes a switched capacitor stage for generating a plurality of output voltages; a reference voltage switching arrangement comprising n individual five-level reference voltage switching arrangements in parallel; and a switching controller operable to control the switched capacitor stage and the reference voltage switching arrangement to generate switching patterns for each of the plurality of output voltages, wherein each pattern comprises a charge phase and a transfer phase; wherein for even transfers a single switching configuration is provided to achieve linearity and wherein for odd transfers an average of different switching combinations is provided to achieve linearity; wherein an even transfer is when an input of the DAC is even and an odd transfer is when an input to the DAC is odd.

In some embodiments, the switched capacitor stage is configured to generate 4n+1 output levels. In some embodiments, the switching controller is configured to control a same number of transfers over each of the n individual five-level reference voltage switching arrangements for VREF and −VREF, where VREF and −VREF are reference voltage inputs to the n individual five level reference voltage switching arrangements. In some embodiments, for odd transfers a randomization of an order of sequences in the transfers is affected.

A method for producing a digital-to-analog converter (DAC) of the charge transfer type, in accordance with embodiments includes providing a switched capacitor stage for generating a plurality of output voltages; providing a reference voltage switching arrangement comprising n individual five-level reference voltage switching arrangements in parallel; and providing a switching controller operable to control the switched capacitor stage and the reference voltage switching arrangement to generate switching patterns for each of the plurality of output voltages, wherein each pattern comprises a charge phase and a transfer phase; wherein for even transfers a single switching configuration is provided to achieve linearity and wherein for odd transfers an average of different switching combinations is provided to achieve linearity; wherein an even transfer is when an input of the DAC is even and an odd transfer is when an input to the DAC is odd.

In some embodiments, the switched capacitor stage is configured to generate 4n+1 output levels. In some embodiments, the switching controller configured to control a same number of transfers over each of the n individual five-level reference voltage switching arrangements for VREF and −VREF, where VREF and −VREF are reference voltage inputs to the n individual five level reference voltage switching arrangements. In some embodiments, for odd transfers a randomization of an order of sequences in the transfers is affected.

A method for operating a digital-to-analog converter (DAC) of the charge transfer type, in accordance with embodiments includes generating a plurality of output voltages with a switched capacitor stage; generating reference voltages using a reference voltage switching arrangement comprising n individual five-level reference voltage switching arrangements in parallel; and controlling the switched capacitor stage and the reference voltage switching arrangement to generate switching patterns for each of the plurality of output voltages, wherein each pattern comprises a charge phase and a transfer phase; wherein for even transfers a single switching configuration is implemented to achieve linearity and wherein for odd transfers an average of different switching combinations is implemented to achieve linearity; wherein an even transfer is when an input of the DAC is even and an odd transfer is when an input to the DAC is odd.

In some embodiments, the switched capacitor stage is configured to generate 4n+1 output levels. In some embodiments, the method includes controlling a same number of transfers over each of the n individual five-level reference voltage switching arrangements for VREF and −VREF, where VREF and −VREF are reference voltage inputs to the n individual five level reference voltage switching arrangements. In some embodiments, the method includes randomizing of an order of sequences in the transfers for odd transfers.

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features and wherein:

FIG. 3A-FIG. 3E show different patterns generating output voltages for a five level digital-to-analog converter;

FIG. 5 illustrates exemplary 4n+1 levels for a n=2 DAC;

FIG. 6 illustrates even transfers for an exemplary n=2 DAC;

FIG. 7 illustrates exemplary odd transfers for an n=2 DAC;

FIG. 8 illustrates exemplary shuffling of sequence order.

DETAILED DESCRIPTION

The disclosure and various features and advantageous details thereof are explained more fully with reference to the exemplary, and therefore non-limiting, embodiments illustrated in the accompanying drawings and detailed in the following description. It should be understood, however, that the detailed description and the specific examples, while indicating the preferred embodiments, are given by way of illustration only and not by way of limitation. Descriptions of known programming techniques, computer software, hardware, operating platforms and protocols may be omitted so as not to unnecessarily obscure the disclosure in detail. Various substitutions, modifications, additions and/or rearrangements within the spirit and/or scope of the underlying inventive concept will become apparent to those skilled in the art from this disclosure.

Figure 1:
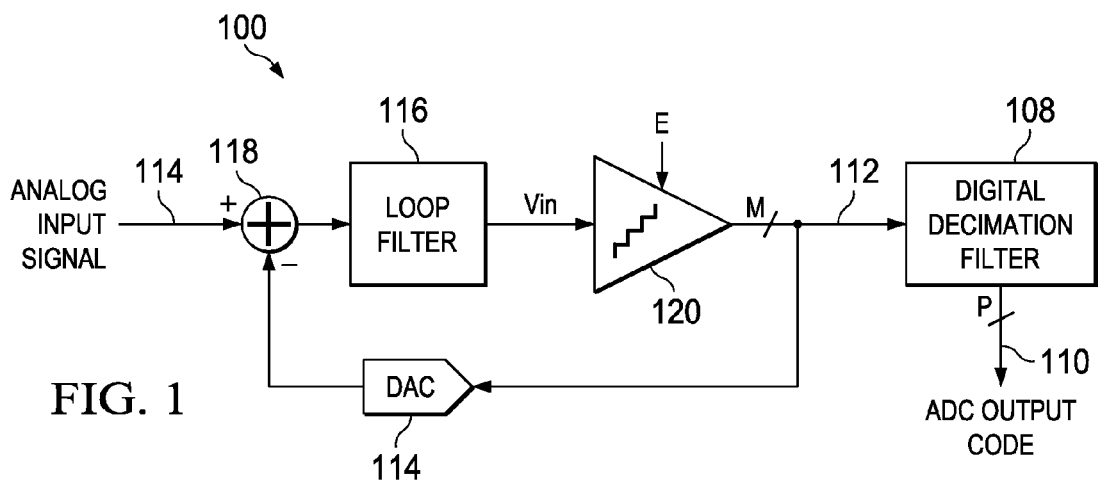
FIG. 1 is a diagram schematically illustrating an exemplary sigma-delta analog-to-digital converter.

Referring again to FIG. 1, depicted is a schematic block diagram of a multi-bit or multi-level (nlev levels, nlev>2, M-bit, M=Floor($\log_2$(nlev)), M>1) single-loop, sigma-delta analog-to-digital converter (ADC). Generally represented by the numeral 100, a multi-level (nlev) sigma-delta ADC with a quantizer (may also be referred to as multi-bit since the encoding of the levels require more than 1 bit, M>1) may include an input voltage summation node 118, a loop filter 116, a multi-bit quantizer 120, a multi-bit digital-to-analog converter (DAC) 114, and a digital decimation filter 108. The quantizer 120 may be a fixed or variable resolution quantizer.

The digital filter 108 receives an over sampled digital bit stream 112 and decimates the digital bit stream 112 so as to produce, for example but is not limited to, a P-bit data word (on bus 110) representative of the measured analog input signal at input 114. This decimation process also removes most of the high frequency noise that is coming from the quantization process and that is noise shaped by the sigma-delta ADC 100 throughout its analog loop filter 116. The transfer function from E (quantization noise introduced by the quantizer) to the output bitstream is a high-pass filter.

The output bitstream 112 from the multi-bit quantizer 120 has nlev distinct levels and may be encoded into a minimum of M-bits, where M=Floor($\log_2$(nlev)) and M is greater than 1. "E" schematically represents the quantization error introduced by the fixed multi-bit quantizer 120.

According to various embodiments, the DAC 114 may be implemented as a multi-bit capacitive DAC of the charge transfer type with 4n+1 levels using only n capacitors and minimal dynamic element matching and a reduced number of switches. More generally, according to various embodiments, sigma delta converters can be provided with multi-level DACs with a minimal number of matched unit capacitors and relatively simple dynamic element matching techniques. This will lead to more accurate sigma delta devices using approximately same size and same power as existing devices.

Figure 2:
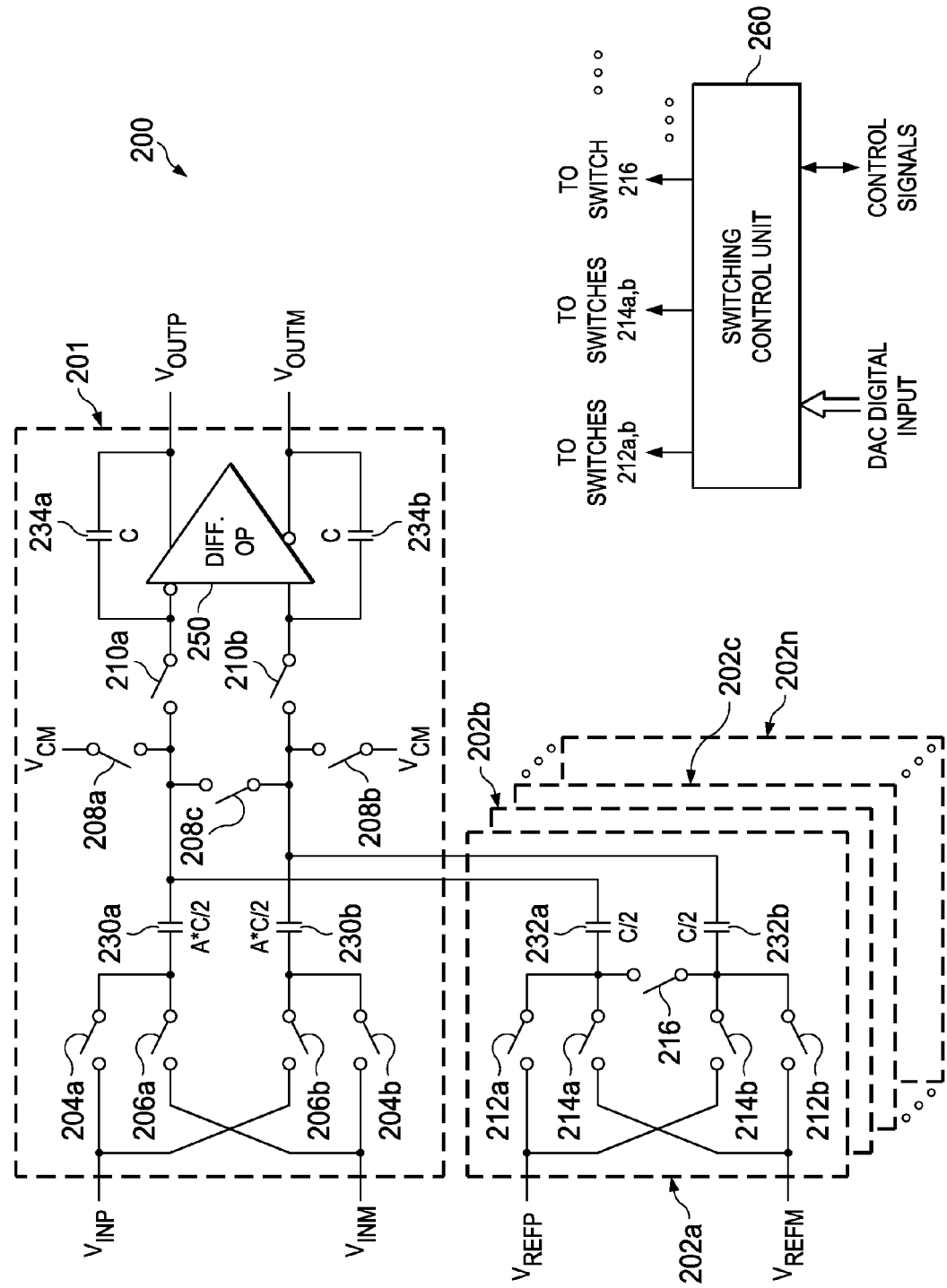
FIG. 2 is a diagram schematically illustrating an exemplary sigma-delta analog-to-digital converter in accordance with embodiments.

Turning now to FIG. 2, a diagram illustrating an exemplary DAC of the charge transfer type is shown. Depicted is a schematic circuit diagram of capacitor switching arrays and a differential amplifier for a multi-level feed-back digital-to-analog converter (DAC).

The multi-level feedback DAC 200 includes a processing circuit 201 and a plurality of reference voltage charging circuits 202a-202n. In the embodiment illustrated, the DAC 200 thus comprises n parallel DACs, each of the n DACs including its own reference voltage charging circuit. Each reference voltage charging circuit and corresponding DAC implements a five-level DAC.

The circuit 200 will be explained first as a five-level DAC implemented with a single reference voltage charging circuit 202a. Such a five-level DAC is described in commonly-assigned U.S. Pat. No. 7,102,558, titled "Five-Level Feed-Back Digital-to-Analog Converter for a Switched Capacitor Sigma-Delta Analog-to-Digital Converter, which is incorporated herein by reference for all purposes.

In the specific example, a five-level feed-back DAC of the charge transfer type can be operated using switching patterns that generate five equally spaced charge quantities during two phases, such as a charge or pre-charge phase and a transfer phase, of a differential charge transfer. Thus, a pattern is defined by two phases according to an embodiment. However, other patterns with more phases may be used. In summary, a pattern is to be understood to generate an output voltage of the DAC. In the following description, a sequence of patterns may be used which refers to a sequence of output voltages in the time domain generated by the DAC.

Each voltage is generated by a switching pattern which, for example, can be generated by a switching control unit 260. Switching control unit 260 receives the DAC digital input word or the multi-level input information which is used to decode or determine which pattern is applied to the switches. FIG. 2 only shows control lines for the switches in the reference voltage switching circuit. However, as indicated by the dotted line switching control unit 260 may generate all necessary switch control signals for the remaining switches of the circuit shown in FIG. 2. As further indicated in FIG. 2, switching control unit 260 may also receive and generate further control signals such as clock signals, conversion start signals, conversion end signals, etc. Furthermore, in embodiments, the switching control unit 260 may provide switch control signals for all n voltage reference modules 202.

A five-level feed-back DAC including a single reference voltage charging unit 202a implements a switching sequence that generates five equally spaced charge quantities during two phases (precharge+transfer) of a differential charge transfer. Thus, the five equally distributed charge levels may be C*VREF, C*VREF/2, 0, −C*VREF/2 and −C*VREF. The reference voltage (VREF=VREFP−VREFM) charging circuit 202a comprises transfer reference capacitors 232a and 232b, and switches 212, 214 and 216. The remainder of the specific exemplary embodiment comprises voltage input capacitors 230a and 230b, switches 204, 206, 208 and 210, and differential operational amplifier 250 having feed-back sampling capacitors 234a and 234b. Switches 208a and 208b may relate to common mode operation, and switch 208c may relate to differential signal operation.

VREFP and VREFM represent voltages at the differential reference input terminals. The reference voltage VREF=VREFP−VREFM. VINP and VINM represent voltages at the differential input signal terminals. The input signal voltage VIN=VINP−VINM. The transfer reference capacitors 232a and 232b may be, for example, equal to C/2. The input sampling capacitors 230a and 230b may be equal to A*C/2. The feed-back capacitors 234a and 234b may be equal to C to get a gain stage of 1 for the reference signals with one DAC stage, although in other embodiments this may differ depending on the desired reference path gain. The input voltage is: VIN=VINP−VINM, and the output voltage is: VOUT=VOUTP−VOUTM. The gain of the circuit shown is A. (If there are multiple sets of C/2 caps in parallel (n times) to do a 4n+1 DAC, the gain is then equal to n, and the feedback caps would be C/n to still get a gain of 1. It is noted, however, that in other embodiments, gain may be different than 1).

When summed with an input voltage, VIN, the five-level feed-back DAC produces five equally distributed output voltages of A*VIN+VREF, A*VIN+VREF/2, A*VIN+0, A*VIN−VREF/2 and A*VIN−VREF, where A is gain, VIN is the input voltage, and VREF is the reference voltage. This is illustrated more particularly with reference to FIG. 3.

Referring to FIGS. 3a-3e, depicted are timing diagrams for conventional switching patterns of the switches 204-216 used to obtain the five equally distributed charge levels C*VREF, C*VREF/2, 0, −C*VREF/2 and −C*VREF of the specific exemplary embodiment illustrated in FIG. 2. A "1" logic level depicts the respective switches in the closed position and a "0" logic level depicts the respective switches in the open position. As shown P1 represents a charging phase of the reference transfer capacitors 232a, 232b, and P2 represents a transfer phase of the charge on the reference capacitors 232a, 232b.

FIGS. 3a-3e further illustrate non-overlapping delays between the switches 104-116 in order to prevent a short between inputs and to ensure that the switches connected to the summing node always open first. The switches 204-216 are all open (off—logic 0) between time 302 and time 304. Time 302 signifies the end of the charging phase for both the reference capacitors 232 and input signal capacitors 230. Time 304 signifies the beginning of the transfer phase from both the reference capacitors 232 and input signal capacitors 230 to the feedback capacitors 234.

Referring to FIG. 3a, depicted is the timing diagram for transferring a plus (positive) charge, C*VREF. The reference capacitors 232a and 232b are connected to VREFP and VREFM, respectively, during the precharge phase (before time 202a) and switched to VREFM and VREFP, respectively, during the transfer phase (after time 204a). The charge transferred is equal to C/2*(VREFP−VREFM)−C/2*(VREFM−VREFP)=C*VREF. When summed with the voltage input sample charge, A*C/2*(VINP−VINM)−A*C/2*(VINM−VINP)=A*C*VIN at the summing node of the input of the differential operational amplifier 250, the transferred voltage is A*VIN+VREF at the output of the differential operational amplifier 250.

Figure 3E:
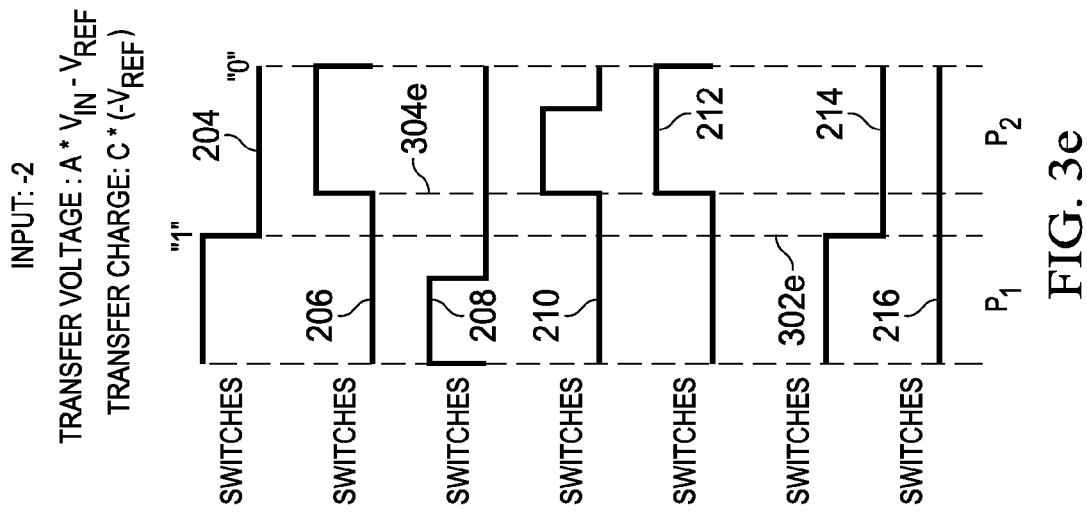

Referring to FIG. 3e, depicted is the timing diagram for transferring a minus (negative) charge, C*(−VREF). The opposite pattern from that shown in FIG. 3a is performed to achieve a −C*VREF charge to the summing node. When summed with the voltage input sample charge, A*C/2*(VINP−VINM)−A/2*C*(VINM−VINP)=A*C*VIN at the summing node of the input of the differential operational amplifier 250, the transferred voltage is A*VIN−VREF at the output of the differential operational amplifier 250. The charging and transferring patterns of FIGS. 3a and 3e represent a basic two level feed-back DAC of a sigma-delta modulator.

Three more charge levels are added to the basic operation of the aforementioned two-level feed-back DAC in order to achieve a five-level DAC. These three additional charge levels are C*VREF/2, 0 and −C*VREF/2.

Referring to FIG. 3b, in order to achieve a C*VREF/2 charge transfer, the reference capacitors 232a and 232b are connected to VREFP and VREFM, respectively, during the precharge phase (before time 402b) and have their input plates short-circuited during the transfer phase (after time 404b). The charge transferred is then equal to C/2*(VREFP−VREFM)−0=C*VREF/2. When summed with the voltage input sample charge, A*C/2*(VINP−VINM)−A*C/2*(VINM−VINP)=A*C*VIN at the summing node of the input of the differential operational amplifier 250, the transferred voltage is A*VIN+VREF/2 at the output of the differential operational amplifier 250.

Referring to FIG. 3c, in order to achieve a zero charge transfer, the input plates of the reference capacitors 232a and 232b are short-circuited during both during the precharge phase (before time 402c) and the transfer phase (after time 204c). When summed with the voltage input sample charge, A*C/2*(VINP−VINM)−A*C/2*(VINM−VINP)= A*C*VIN at the summing node of the input of the differential operational amplifier 150, the transferred voltage is A*VIN+0 at the output of the differential operational amplifier 150.

Figure 3D:
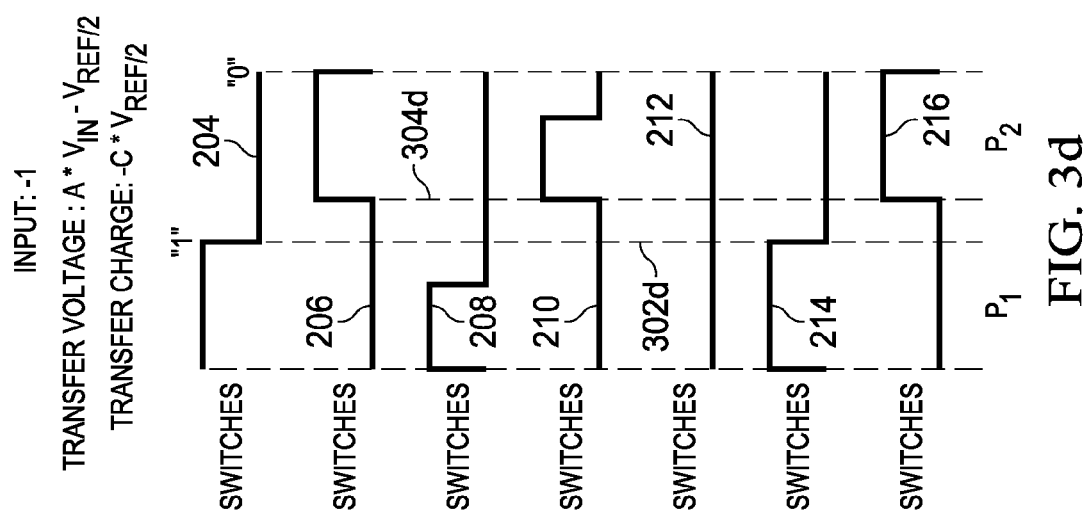

Referring to FIG. 3d, in order to achieve a −C*VREF charge transfer, the reference capacitors 232a and 232b are connected to VREFM and VREFP, respectively, during the precharge phase (before time 202d) and have their input plates short-circuited during the transfer phase (after time 204d). The charge transferred is then equal to C*(VREFM−VREFP)−0=−C*VREF. When summed with the voltage input sample charge, A*C*(VINP−VINM)−A*C*(VINM−VINP)=2A*C*VIN at the summing node of the input of the differential operational amplifier 250, the transferred voltage is A*VIN−VREF/2 at the output of the differential operational amplifier 250.

As noted above, according to various embodiments, multiple of these DACs may be used in parallel by having a circuit with n voltage reference charging circuits 202 (n times in parallel) in order to go beyond a 5-level resolution. A difficulty of having multiple 5-level DACs in parallel is the matching between the capacitors.

For example, consider a DAC of the charge transfer type having n voltage reference charging circuits in which all capacitors are unit capacitors but they have mismatch because of physical processing constraints. As noted above, each DAC has a different, independent input and each input can be either +2/+1/0/−1/−2. Each of these values represents a C*Vref multiple in the DAC charge transfer (if the mismatch in each capacitor pair is neglected and if Vref=VREF+−VREF−). The mismatch in the capacitor pair (e.g., 232a, 232b) in the differential structure is not considered since only the differential charge is integrated further, therefore, even if the capacitors are not perfectly matched on the + and the − side of the differential structure, it is equivalent to have a perfect matching with the average of the capacitors for the pure differential transfer. Therefore the system can be simplified and it can be considered that the capacitors on each side of the differential structure are equal.

More generally, according to embodiments, n DACs can be used in parallel with each one of these having a Cref(k) capacitor and transferring in(k)*Cref(k)*Vref, where in(k) is an integer that can charge transfer since all DACs are in parallel. If all the capacitors are perfectly equal to Cref, and if there are n DACs in parallel, the charge transfers are comprised between 2n*Cref*Vref and −2n*Cref*Vref with a granularity of 1*Cref*Vref. This results in 4n+1 levels total. So with n 5-level DACs, a circuit having 4n+1 levels of resolution is achieved if the capacitors are the same unit capacitors. The linearity is maintained if the capacitors are perfectly matched.

Figure 4:
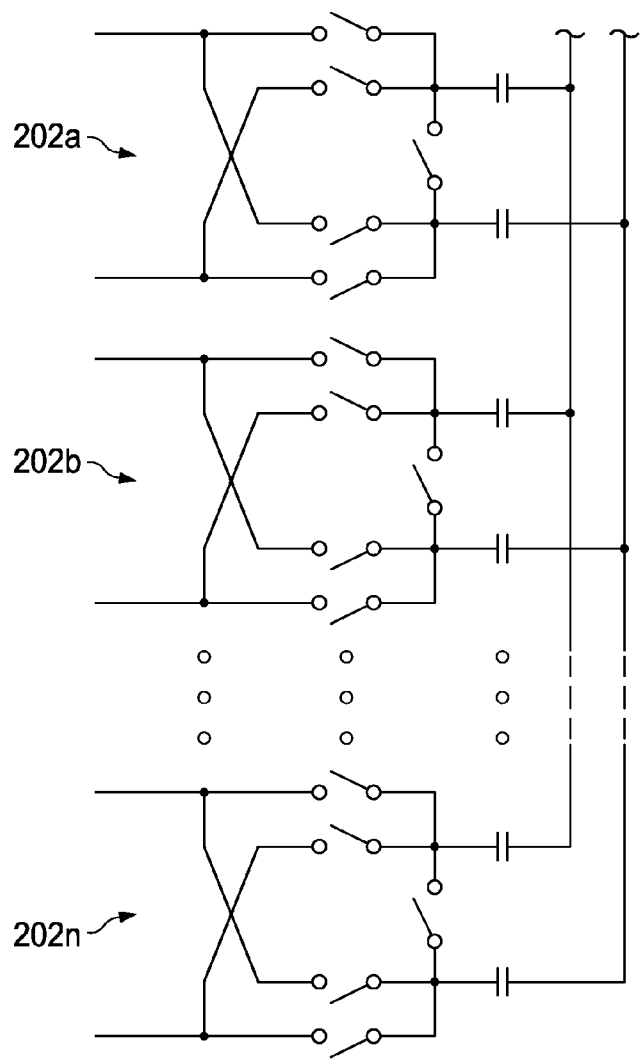
FIG. 4 illustrates exemplary reference voltage charging circuit according to embodiments.

For example, shown in FIG. 4 is a configuration more particularly showing the n voltage reference blocks. As will be discussed in greater detail below, the switching control unit 260 (FIG. 2) may be used to control the switching of corresponding switches to achieve the desired output levels.

FIG. 5 is a table showing an example of charge transfer for an n=2 configuration, that is, with two unit capacitors 232a1, 232b1, 232a2, 232b2. In this case, the DAC inputs take on (4n+1)=9 levels and, in particular, 4, 3, 2, 1, 0, −1, −2, −3, and −4. Shown are charges transferred on C1 and C2 (i.e., the individual DACs) during the phases P1 and P2, and the sum of all charges transferred. The last column represents a normalized sum. 0 may also be obtained with a C*VREF/4 transfer on P1 and a −C*VREF/2 transfer on P2.

The example of FIG. 5 supposes perfect matching. Difficulties may arise because in all likelihood, the capacitors will not be matched but it is still desired to maintain the linearity of the DAC. The ultimate goal is to have the total charge transferred always proportional to the sum of all Cref(k) capacitors. This is possible if a sequence of charge transfers is processed by the DAC. At each input processed, the DAC linearity may not be guaranteed, but after a certain number of transfers, the linearity can be maintained if the total charge transferred is considered.

In a sigma-delta ADC, the DAC is typically used in the feedback loop of the modulator and the output of the DAC is constantly integrated during a conversion. So as long as the linearity of the DAC is maintained, even if it comes after several integrations, it will not impact the linearity of the delta-sigma ADC (provided that the modulator loop stability is not degraded during the sequencing). In other words, a dynamic element matching or dynamic weight averaging technique can be applied to maintain DAC linearity. Since the largest charge transfer is always equal to 2*Cref(k)*Vref, the total transfer (if all DACs have respectively their inputs equal to +2) is Sum(Cref(k))*2*Vref, so in order to maintain DAC linearity, all other transfers need to be proportional to Sum (Cref(k)). However, since the capacitors are not matched, this is only possible with chosen sequences for each input so that on average the total charge transferred is proportional to Sum(Cref(k)).

Out of the 4n+1 levels of the DAC, five levels do not need sequencing (corresponding to C*VREF, C*VREF/2, 0, −C*VREF/2 and −C*VREF). These levels are the ones obtained when all 5-level DACs in parallel share the same inputs. This would be equivalent to having only one Cref with the equivalent value of Sum(Cref(k)). The "sequence" here is 1 sample long. Thus, each level needs to have a charge transferred equal in average to +/−2*Sum(Cref(k))*Vref*m/n where m is an integer in order to maintain DAC linearity. This gives the 4n+1 levels allowed by the DAC. So at the input, the input of the DAC can be represented by an integer m between 2n and −2n.

For a 2n−1 input, all DACs in parallel may have a 2Cref (k)Vref charge transfer except one that only needs a 1*Cref (j)*Vref charge transfer. This DAC number j has a different charge transfer than all others. By changing j in a sequence so that it can take all values from 1 to n, after n samples, the total charge transferred will be Sum ((2*Sum(Cref(k)Vref)), k different than j+Cref(j)Vref with j from 1 to n=n*(2n−1)Sum (Cref(k))Vref which is the charge value for maintaining DAC linearity. So a simple sequence can be found that has n samples to average the mismatch error for the DAC input (2n−1). It can be shown that such sequences can be found for any m and that they can always be equal or shorter than n. So for each input a sequence is found with at most n samples that will average the DAC charge transfer so that the linearity is maintained. This sequence can be randomized to avoid tones in the output spectrum (the choice of the j can be random as long as all integers from 1 to n are taken after the DAC has been processed n times with the input code 2n−1).

These sequences can even be averaged over multiple input codes. As will be discussed in greater detail below with reference to the example of FIG. 7, a sequence may be shown where one DAC was having a simple charge transfer where all others have a double one, and then rotating/changing the one that was having a single transfer lead to averaging and maintaining the linearity of the DAC, but this presupposed that the DAC input was constant. So a sequence per DAC input was needed in this case, which can be large since there are 4n+1−5 sequences to maintain. Other more complex sequences can be realized where the averaging will be taking in account multiple input codes always with the same goal of averaging the DAC transfers to be proportional to Sum((Cref(k))Vref. Here what needs to be registered (in the logic of the DAC circuit) is the difference from an actual Sum(Cref(k))Vref transfer.

For example in a 2n−1 input transfer, one of the DACs has a single transfer, the transfer is not 2n−1*Sum(Cref(k))Vref/n but 2Sum(Cref(k))Vref, k different than j+Cref(j)Vref. In this case, the difference from an integer number of Sum(Cref(k))* Vref transfer is −Cref(j)*Vref. The sequence can register this difference (−1 on the j-th cap) and can try to compensate for it with another DAC input. For example if the DAC input is +1, the shortest way to compensate this difference is to do a simple transfer on the j-th cap: Cref(j)Vref. This way, after the 2 samples (one at 2n−1 and one at 1), the DAC charge transfer is proportional to the Sum(Cref(k))Vref and the DAC linearity is maintained. For a given m, the complimentary to a 2n (2n−m) can follow the complementary sequence to cancel the DAC non linearity. In these charge transfers, a chopper modulated Vref can be used and have the charge transfers in each DAC in parallel follow the sequences as shown, for example, in commonly-assigned U.S. Pat. No. 7,994,958 in order to cancel the offset in each DAC.

For this, an odd transfer and an even transfer at the input of each DAC can be defined. An even transfer is when an input of the DAC is even (+/−2 or 0) and an odd transfer is when the input is odd (+/−1, +/−3). The even transfers cancel the offset of the Vref per the teachings of the U.S. Pat. No. 7,994,958. The odd transfers need a sequence of 2 samples to completely cancel the offset. These sequences need to be performed on each DAC individually to cancel completely the offset at the output of the DAC. Here again, a randomization of these sequences of 2 samples per DAC can be realized to further break output tones in the output spectrum.

For example, the goal with a two capacitor (C1 and C2, corresponding to a two DAC, e.g., 202a, 202b) design is to be sure to have the same number of transfers using C1 and C2 for +VREF and −VREF. This is already the case for even transfers, i.e., (inputs of 4/2/0/−2/−4), and for these, there are no matching issues. This is shown with reference to FIG. 6. As can be appreciated, the result is 5 levels with perfect linearity. However, for other transfers (i.e., odd transfers), C1 and C2 transfers have to be different, but multiple combinations are possible. That is, by varying the combinations over time with a predefined sequence and averaging can make the number of C1 and C2 transfers the same.

For odd transfers, an average of combinations may be obtained that is proportional to C1+C2. Thus, on average, the DAC will be linear. In such a case, the sequence to get the average to be proportional to C1+C2 can be only 2 samples long (n samples minimum if using n caps).

Thus, for example, FIG. 7 illustrates sequences that will average every sequence of independent odd transfers and are proportional to C1+C2. In some embodiments, sequences may also cancel the offset of the VREF if VREF is chopped between P1 and P2.

Since odd transfers induce a sequence of different transfers, if the same odd transfers are repeated over and over, a periodic pattern will appear which can induce tones. The pattern can be broken or dithered by choosing randomly the first transfer at each beginning the sequence. (That is, the order of the sequence is not important). Shuffling the order of the sequence can dither the patterns and attenuate the tonal behavior without enlarging the number of samples required to cancel the mismatch for odd transfers.

This is shown by way of example in FIG. 8. More particularly, shown in FIG. 8 is a table of the transfers on C1 and C2. The four samples 1-4 have transfer sequences with the starting C1 or C2 chosen randomly to avoid a periodic pattern.

Large number of DACs in parallel require large oversampling ratios in the sigma delta ADC in which the DAC is implemented so that the averaging on n samples can be done over all possible levels of the DAC and such that any remainder of the non linearity error can be neglected over the number of samples. In order to minimize the sequence length and therefore the possibility of having large remainders at the end of the conversion, the more complex sequences are applied where at each sample the sequencer will try to enable DAC charge transfers in all DACs so that the total DAC charge transfers is closer to an integer value of Sum((Cref(k))*Vref. The sequencer can maintain a count of the total charge integrated on each DAC and try to equate this sum at each sample or at least be closer to have this sum equal on the n DACs.

Although the invention has been described with respect to specific embodiments thereof, these embodiments are merely illustrative, and not restrictive of the invention. The description herein of illustrated embodiments of the invention, including the description in the Abstract and Summary, is not intended to be exhaustive or to limit the invention to the precise forms disclosed herein (and in particular, the inclusion of any particular embodiment, feature or function within the Abstract or Summary is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function, including any such embodiment feature or function described in the Abstract or Summary.

While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Reference throughout this specification to "one embodiment", "an embodiment", or "a specific embodiment" or similar terminology means that a particular feature, structure, or characteristic described in connection with the embodiment is included in at least one embodiment and may not necessarily be present in all embodiments. Thus, respective appearances of the phrases "in one embodiment", "in an embodiment", or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, process, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, including the claims that follow, a term preceded by "a" or "an" (and "the" when antecedent basis is "a" or "an") includes both singular and plural of such term, unless clearly indicated within the claim otherwise (i.e., that the reference "a" or "an" clearly indicates only the singular or only the plural). Also, as used in the description herein and throughout the claims that follow, the meaning of "in" includes "in" and "on" unless the context clearly dictates otherwise.

It will be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/Figures should be considered only as exemplary, and not limiting, unless otherwise specifically noted.

What is claimed is:

1. A digital-to analog converter (DAC) of the charge transfer type for use in a sigma delta modulator, comprising:
   a capacitor switch unit operable to generate a 4n+1 output levels, comprising:
   a plurality of second switching units for coupling first terminals of a plurality of reference capacitor pairs with either a positive or a negative reference signal;
   wherein the second terminals of the plurality of reference capacitor pairs are coupled in parallel, respectively;
   wherein for even transfers a single switching combination is provided to achieve linearity and wherein for odd transfers an average of different switching combinations is provided to achieve linearity;
   wherein an even transfer is when an input of the DAC is even and an odd transfer is when an input to the DAC is odd.

2. The DAC of claim 1 wherein the switches for each one of the plurality of second switching units are independently controlled.

3. A sigma delta modulator comprising:
   a DAC of the charge transfer type including
   a capacitor switch unit operable to generate a 4n+1 output levels, and
   a plurality of second switching units for coupling first terminals of a plurality of reference capacitor pairs with either a positive or a negative reference signal;

wherein the second terminals of the plurality of reference capacitor pairs are coupled in parallel, respectively; and a first switching unit for coupling first terminals of an input capacitor pair with either a positive or a negative input signal, wherein the second terminals of the input capacitor pairs and the plurality of reference capacitor pairs are coupled in parallel, respectively;

wherein for even transfers a single switching configuration is provided to achieve linearity and wherein for odd transfers an average of different switching combinations is provided to achieve linearity;

wherein an odd transfer is when an input of the DAC is even and an odd transfer is when an input to the DAC is odd.

4. The sigma delta modulator according to claim 3, further comprising a switching network coupling the second terminals of the input and reference capacitors with a differential amplifier.

5. A digital-to-analog converter (DAC) of the charge transfer type, comprising:
    a reference voltage switching arrangement comprising n individual five-level reference voltage switching arrangements in parallel;
    a switched capacitor stage for generating 4n+1 output voltage levels; and
    a switching controller, the switching controller configured to control switching configurations;
    wherein for even transfers a single switching configuration is provided to achieve linearity and wherein for odd transfers an average of different switching combinations is provided to achieve linearity;
    wherein an even transfer is when an input of the DAC is even and an odd transfer is when an input to the DAC is odd.

6. A digital-to-analog converter in accordance with claim 5, the switching controller configured to aperiodically select an order of transfers for odd transfers.

7. A digital-to-analog converter (DAC) of the charge transfer type, comprising:
    a switched capacitor stage for generating a plurality of output voltages;
    a reference voltage switching arrangement comprising n individual five-level reference voltage switching arrangements in parallel; and
    a switching controller operable to control the switched capacitor stage and the reference voltage switching arrangement to generate switching patterns for each of the plurality of output voltages, wherein each pattern comprises a charge phase and a transfer phase;
    wherein for even transfers a single switching configuration is provided to achieve linearity and wherein for odd transfers an average of different switching combinations is provided to achieve linearity;
    wherein an even transfer is when an input of the DAC is even and an odd transfer is when an input to the DAC is odd.

8. A digital-to-analog converter in accordance with claim 7, wherein the switched capacitor stage is configured to generate 4n+1 output levels.

9. A digital-to-analog converter in accordance with claim 8, the switching controller configured to control a same number of transfers over each of the n individual five-level reference voltage switching arrangements for VREF and −VREF, where VREF and −VREF are reference voltage inputs to the n individual five level reference voltage switching arrangements.

10. A digital-to-analog converter in accordance with claim 7, wherein for odd transfers a randomization of an order of sequences in the transfers is effected.

11. A method for producing a digital-to-analog converter (DAC) of the charge transfer type, comprising:
    providing a switched capacitor stage for generating a plurality of output voltages;
    providing a reference voltage switching arrangement comprising n individual five-level reference voltage switching arrangements in parallel; and
    providing a switching controller operable to control the switched capacitor stage and the reference voltage switching arrangement to generate switching patterns for each of the plurality of output voltages, wherein each pattern comprises a charge phase and a transfer phase;
    wherein for even transfers a single switching configuration is provided to achieve linearity and wherein for odd transfers an average of different switching combinations is provided to achieve linearity;
    wherein an even transfer is when an input of the DAC is even and an odd transfer is when an input to the DAC is odd.

12. A method in accordance with claim 11, wherein the switched capacitor stage is configured to generate 4n+1 output levels.

13. A method in accordance with claim 12, the switching controller configured to control a same number of transfers over each of the n individual five-level reference voltage switching arrangements for VREF and −VREF, where VREF and −VREF are reference voltage inputs to the n individual five level reference voltage switching arrangements.

14. A method in accordance with claim 11, wherein for odd transfers a randomization of an order of sequences in the transfers is effected.

15. A method for operating a digital-to-analog converter (DAC) of the charge transfer type, comprising:
    generating a plurality of output voltages with a switched capacitor stage;
    generating reference voltages using a reference voltage switching arrangement comprising n individual five-level reference voltage switching arrangements in parallel; and
    controlling the switched capacitor stage and the reference voltage switching arrangement to generate switching patterns for each of the plurality of output voltages, wherein each pattern comprises a charge phase and a transfer phase;
    wherein for even transfers a single switching configuration is implemented to achieve linearity and wherein for odd transfers an average of different switching combinations is implemented to achieve linearity;
    wherein an even transfer is when an input of the DAC is even and an odd transfer is when an input to the DAC is odd.

16. A method in accordance with claim 15, wherein the switched capacitor stage is configured to generate 4n+1 output levels.

17. A method in accordance with claim 15, further comprising controlling a same number of transfers over each of the n individual five-level reference voltage switching arrangements for VREF and −VREF, where VREF and −VREF are reference voltage inputs to the n individual five level reference voltage switching arrangements.

18. A method in accordance with claim 15, further comprising randomizing of an order of sequences in the transfers for odd transfers.

* * * * *